(12) United States Patent
Wu

(10) Patent No.: US 11,776,582 B1
(45) Date of Patent: Oct. 3, 2023

(54) HARD DISK FIXING DEVICE AND SERVER

(71) Applicant: INSPUR SUZHOU INTELLIGENT TECHNOLOGY CO., LTD., Jiangsu (CN)

(72) Inventor: Chun Hsien Wu, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/034,053

(22) PCT Filed: Nov. 30, 2021

(86) PCT No.: PCT/CN2021/134393
§ 371 (c)(1),
(2) Date: Apr. 26, 2023

(87) PCT Pub. No.: WO2022/267347
PCT Pub. Date: Dec. 29, 2022

(30) Foreign Application Priority Data

Jun. 21, 2021 (CN) .......................... 202110686878.5

(51) Int. Cl.
*H05K 7/14* (2006.01)
*G11B 33/04* (2006.01)
*H05K 1/18* (2006.01)

(52) U.S. Cl.
CPC ......... *G11B 33/0405* (2013.01); *H05K 1/181* (2013.01)

(58) Field of Classification Search
CPC .......... H05K 5/00; H05K 5/02; H05K 5/0262; H05K 5/0282; H05K 5/0286; H05K 5/04; H05K 5/06; H05K 7/00; H05K 7/14; H05K 7/1483; H05K 7/1489; H05K 7/18; H05K 7/183; G11B 33/0461
USPC ......... 361/679.33, 679.37–679.39, 752–759, 361/801–802
See application file for complete search history.

(56) References Cited

U.S. PATENT DOCUMENTS

| | | | | |
|---|---|---|---|---|
| 5,815,377 A | * | 9/1998 | Lund | H01R 12/722 361/756 |
| 5,879,175 A | * | 3/1999 | Muramatsu | G06K 7/0047 235/479 |
| 6,115,258 A | * | 9/2000 | Hoyle, Jr. | H05K 7/1409 361/752 |

(Continued)

FOREIGN PATENT DOCUMENTS

| CN | 2587006 Y | 11/2003 |
|---|---|---|
| CN | 2689317 Y | 3/2005 |

(Continued)

*Primary Examiner* — Tuan T Dinh
(74) *Attorney, Agent, or Firm* — IPRO, PLLC

(57) ABSTRACT

Disclosed in the present disclosure is a hard disk fixing device, including: a seating, which includes a base fixed on a main board and a first pair of elastic buckles perpendicular to the base and arranged at two sides thereof; a first supporting seat, which includes a main body and an extending portion extending from the main body, wherein the extending portion may be snap-fitted between the first pair of elastic buckles, a first guiding slot is provided inside the main body and a through hole is provided in a side surface of the main body, and the first guiding slot is in communication with the through hole; a first adjusting fastener, which includes a sliding rod and a limiting rod connected to the sliding rod.

20 Claims, 7 Drawing Sheets

(56) References Cited

U.S. PATENT DOCUMENTS

| | | | | |
|---|---|---|---|---|
| 6,411,517 B1 * | 6/2002 | Babin | ............... | H05K 7/1461 |
| | | | | 361/759 |
| 6,424,542 B1 * | 7/2002 | Benson | ............ | G06K 13/085 |
| | | | | 361/801 |
| 7,351,108 B2 * | 4/2008 | Ting | .................. | H01R 13/629 |
| | | | | 439/64 |
| 7,453,690 B2 * | 11/2008 | Denny | ............ | H05K 7/1409 |
| | | | | 361/679.33 |

FOREIGN PATENT DOCUMENTS

| | | |
|---|---|---|
| CN | 201298189 Y | 8/2009 |
| CN | 201449740 U | 5/2010 |
| CN | 105224044 A | 1/2016 |
| CN | 205788049 U | 12/2016 |
| CN | 206178556 U | 5/2017 |
| CN | 107102705 A | 8/2017 |
| CN | 109542185 A | 3/2019 |
| CN | 210666612 U | 6/2020 |
| CN | 12612737 A | 4/2021 |
| CN | 113253812 A | 8/2021 |
| WO | 2018154640 A1 | 8/2018 |

* cited by examiner

HARD DISK FIXING DEVICE AND SERVER

CROSS-REFERENCE TO RELATED APPLICATION

The present disclosure claims the priority of the Chinese patent application filed on Jun. 21, 2021 before the China National Intellectual Property Administration with the application number of 202110686878.5 and the title of "HARD DISK FIXING DEVICE AND SERVER", which is incorporated herein in its entirety by reference.

FIELD

The present disclosure relates to the field of servers and, more particularly, to a hard disk fixing device and a server.

BACKGROUND

Nowadays, small SSD cards such as M.2 SSDs have many different lengths (for example, 30 mm, 42 mm, 60 mm, 80 mm, and 110 mm). In order to support the M.2 cards with various lengths, holes need to be formed in a main card. There are two application methods for forming holes. The first is to break a circular hole to allow a surface mount technology (SMT) stud to be welded. After being assembled, the M.2 SSD is fixed by locking a screw to the stud. The second is to use a tool-free plastic buckle. After being assembled, the M.2 SSD is fixed in a hole by a plastic card, so as to avoid loosening. However, both of the above two methods need to form more holes in a main board, which greatly limits the wiring of the main board and results in difficulty in implementing a circuit, thereby causing the need to increase the number of layers to increase the product cost.

SUMMARY

In view of this, in order to overcome at least one aspect of the problems stated above, the embodiments of the present disclosure discloses a hard disk fixing device, including:
 a seating including a base fixed on a main board and a first pair of elastic snap-fit members perpendicular to the base and arranged at two sides of the base;
 a first supporting seat including a main body and an extending portion extending from the main body, wherein the extending portion is capable of being snap-fitted between the first pair of elastic snap-fit members, a first guiding slot is arranged inside the main body and a through hole is arranged in a side surface of the main body, and the first guiding slot is in communication with the through hole;
 a first adjusting fastener including a sliding rod and a limiting rod connected to the sliding rod, wherein the limiting rod is aligned with a connector on the main board and configured for connecting to a hard disk to be fixed, and the sliding rod is capable of sliding in the first guiding slot to adjust a distance between the limiting rod and the connector; and
 a locking member arranged in the through hole and capable of abutting against the sliding rod to lock the sliding rod.

In some embodiments, the sliding rod of the first adjusting fastener is located between the limiting rod of the first adjusting fastener and the connector; or, the limiting rod of the first adjusting fastener is located between the sliding rod of the first adjusting fastener and the connector.

In some embodiments, a second guiding slot is further arranged inside the main body;
 the hard disk fixing device further includes a second adjusting fastener having a second sliding rod and a second limiting rod;
 wherein the second sliding rod of the second adjusting fastener is arranged in the second guiding slot; the second limiting rod of the second adjusting fastener is aligned with a second connector on the main board and configured for connecting to the hard disk to be fixed; and a distance between the second limiting rod of the second adjusting fastener and the main board is greater than a distance between the limiting rod of the first adjusting fastener and the main board.

In some embodiments, the second sliding rod of the second adjusting fastener includes:
 a limiting hole disposed in the second sliding rod of the second adjusting fastener;
 a limiting slot disposed in a side surface of the second sliding rod of the second adjusting fastener, one end of the second limiting rod of the second adjusting fastener having a first elastic buckle and a second elastic buckle;
 wherein the first elastic buckle is inserted into the limiting slot, and the second elastic buckle is inserted into the limiting hole; or, the first elastic buckle is inserted into the limiting hole, and the second elastic buckle is inserted into the limiting slot.

In some embodiments, the second sliding rod of the second adjusting fastener is located between the second limiting rod of the second adjusting fastener and the second connector in a state that the first elastic buckle is inserted into the limiting slot, and the second elastic buckle is inserted into the limiting hole; and
 the second limiting rod of the second adjusting fastener is located between the second sliding rod of the second adjusting fastener and the second connector in a state that the first elastic buckle is inserted into the limiting hole, and the second elastic buckle is inserted into the limiting slot.

In some embodiments, the first supporting seat further includes:
 a limiting portion connected to the other end of the extending portion, wherein the first pair of elastic snap-fit members are located between the limiting portion and the main body in a state that the extending portion is snap-fitted between the first pair of elastic snap-fit members.

In some embodiments, the seating further includes a second pair of elastic snap-fit members; and
 the hard disk fixing device further includes a second supporting seat with the same structure as the first supporting seat, a third adjusting fastener with the same structure as the first adjusting fastener, and a fourth adjusting fastener with the same structure as the second adjusting fastener.

In some embodiments, the first supporting seat further includes:
 a second main body connected to the extending portion, wherein the structure of the second main body is the same as the structure of the main body.

In some embodiments, the hard disk fixing device further includes a third adjusting fastener with the same structure as the first adjusting fastener, and a fourth adjusting fastener with the same structure as the second adjusting fastener.

On the basis of the same inventive concept, the embodiments of the present disclosure further provide a server, including the hard disk fixing device according to any one of embodiments stated above.

The present disclosure has one of the following beneficial technical effects: the solution disclosed by the present disclosure only needs to fix the base on the main board, which reduces the number of openings on the main board, thereby increasing the wiring space on the main board.

BRIEF DESCRIPTION OF THE DRAWINGS

In order to explain the embodiments of the present disclosure or the technical solutions in the prior art more clearly, a brief description may be given below with reference to the accompanying drawings which are used in the description of the embodiments or the prior art, and it is obvious that the drawings in the description below are merely some embodiments of the present disclosure, and a person skilled in the art may obtain other embodiments according to these drawings without involving any inventive effort.

DETAILED DESCRIPTION

For clearer descriptions of the objectives, technical solutions, and advantages of the present disclosure, embodiments of the present disclosure are described hereinafter in detail with reference to embodiments and the accompanying drawings.

It should be noted that all expressions using "first" and "second" in the embodiments of the present disclosure are intended to distinguish two different entities or parameters with the same name. It may be seen that "first" and "second" are merely for the convenience of expressions and should not be construed as limiting the embodiments of the present disclosure, which may not be stated one by one in subsequent embodiments.

Figure 1:
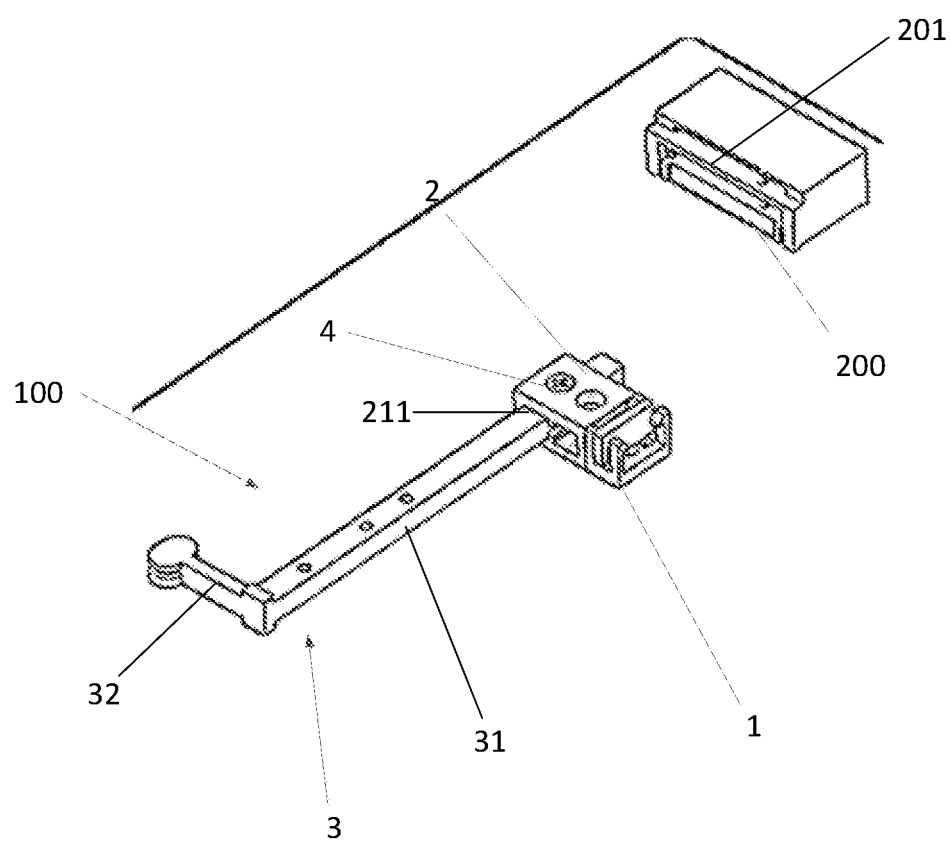
FIG. 1 is a schematic diagram of a hard disk fixing device provided by an embodiment of the present disclosure.

According to one aspect of the present disclosure, the embodiments of the present disclosure provide a hard disk fixing device 100, which is arranged on a main board 300 and may be configured for fixing a solid state disk. As shown in FIG. 1, the hard disk fixing device 100 may include a seating 1, a first supporting seat 2, a first adjusting fastener 3, and a locking member 4.

Figure 2:
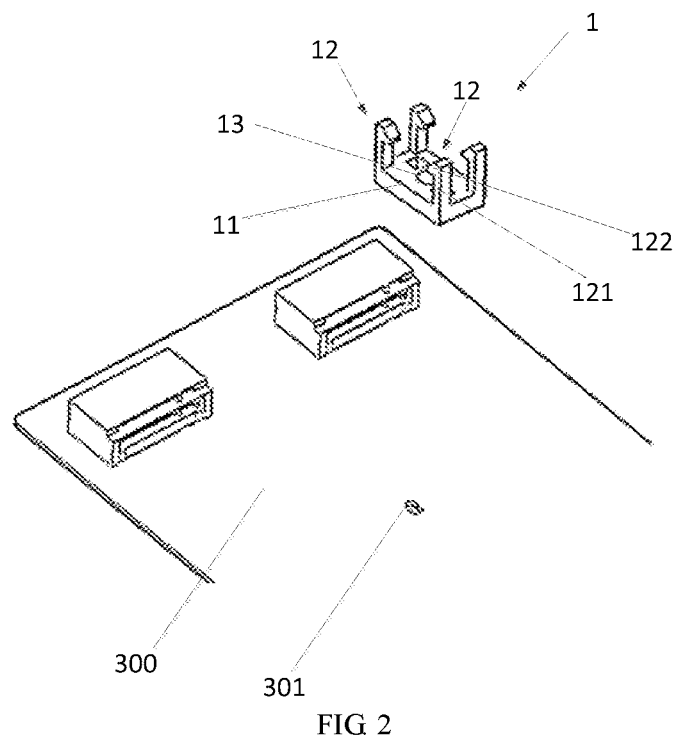
FIG. 2 is a schematic structural diagram of a seating provided by an embodiment of the present disclosure.

In some embodiments, as shown in FIG. 2, the seating 1 may be fixed to the main board 300. Both the length and the width of the seating 1 are small, so the seating 1 may be locked to the main board 300 with a screw by only forming a small hole 301 in the main board 300.

In some embodiments, as shown in FIG. 2, the seating 1 may include a base 11 and a first pair of elastic snap-fit members 12. A hole 13 may be disposed in the base 11. The hole 13 is aligned with a small hole 301 in the main board 300 to realize fixing through the screw. The first pair of elastic snap-fit members 12 may include two elastic snap-fit members. The two elastic snap-fit members are vertically connected to the base 11 and are respectively arranged at both sides of the base 11. Each elastic snap-fit member includes an elastic arm 121 and a triangular snap-fit member 122 arranged at one end, far away from the base 11, of the elastic arm and protrudes inwards.

Figure 3:
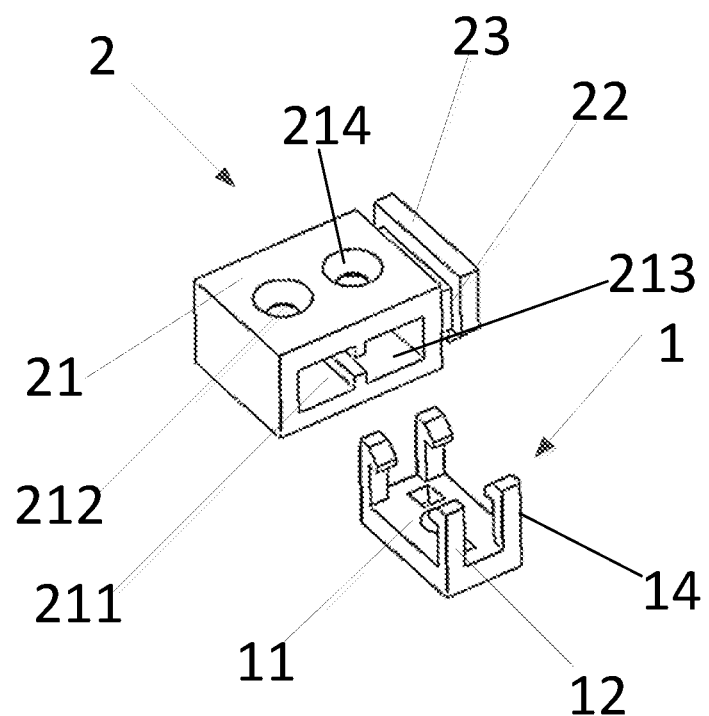
FIG. 3 is a schematic structural diagram of a first supporting seat provided by an embodiment of the present disclosure.

In some embodiments, the first supporting seat 2 as shown in FIG. 1 and FIG. 3 may include a main body 21 and an extending portion 22 extending from the main body 21. The extending portion 22 may extend out from a side surface of the main body 21, and both the length and the height of a cross section of the extending portion 22 are less than the length and the height of the side surface of the main body 21. In order to be snap-fitted between the first pair of elastic snap-fit members 12 under the action of an external force and not produce relative displacement, the length of the cross section of the extending portion 22 is not less than a distance between the first pair of elastic snap-fit members 12, the height of the cross section is equal to the height of the elastic arm, and the distance extended by the extending portion 22 from the main body 21 is not less than the width of the triangular snap-fit member.

Figure 4:
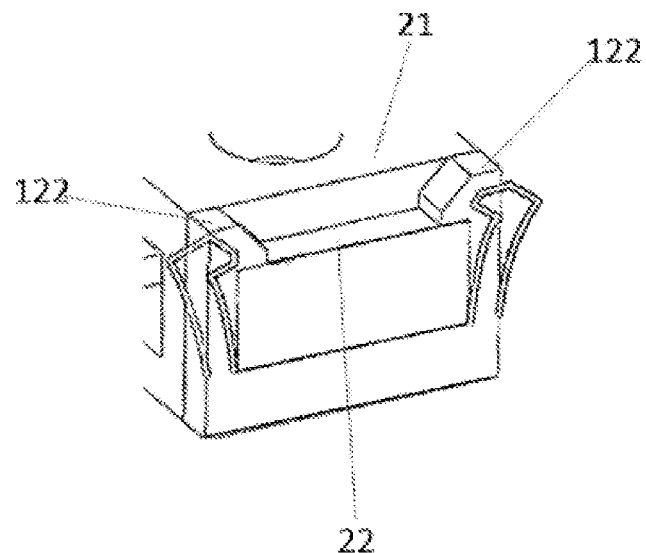
FIG. 4 is a schematic structural diagram of snap-fitting of an extending portion and a first pair of elastic snap-fit members provided by an embodiment of the present disclosure.

In some embodiments, as shown in FIG. 4, the triangular snap-fit member 122 protrudes inwards, so the first pair of elastic snap-fit members 12 is propped open outwards when the extending portion 22 is snap-fitted into the first pair of elastic snap-fit members 12, and the triangular snap-fit member 122 may be snap-fitted at a top surface of the extending portion 22 after the extending portion 22 is completely inserted between the first pair of elastic snap-fit members 12.

In some embodiments, the first supporting seat 2 as shown in FIG. 3 may further include a first guiding slot 211 and a through hole 212. The first guiding slot 211 is disposed inside the main body 21 and penetrates through the whole main body 21. The through hole 212 may be disposed in a top surface of the main body 21 and is in communication with the first guiding slot 211.

In some embodiments, the hard disk fixing device 100 as shown in FIG. 1 further includes a first adjusting fastener 3. The first adjusting fastener 3 has a sliding rod 31 and a limiting rod 32 connected to the sliding rod 31. The limiting rod 32 is aligned with the connector 200 which is on the main board 300 and the connector 200 is configured for connecting the solid state disk, so that the limiting rod 32 may fix the M.2 SSD connected to the connector 200. The sliding rod 31 slides in the first guiding slot 211 to adjust a distance between the limiting rod 32 and the connector 200. In some embodiments, a plurality of screw holes cooperating the through hole 212 may also be disposed in the sliding rod 31. In this way, after the sliding rod is adjusted in place, the locking member 4 is inserted into the screw hole to realize locking.

In this way, the distance between the limiting rod 32 and the connector 200 may be adjusted by adjusting the position of the sliding rod 31 in the first guiding slot 211, so as to fix M.2 SSDs with different lengths.

In some embodiments, the hard disk fixing device 100 as shown in FIG. 1 further includes a locking member 4. The locking member 4 may abut against a sliding rod to lock the same. The "abut against" may include, for example, compressing the sliding rod or inserting the sliding rod. The locking member 4 may be a common screw or other screws capable of providing a locking function. When the locking member 4 is arranged in the through hole 212 and the locking member 4 locks, the sliding rod 31 is in a fixed state, and then the limiting rod 32 is located in a fixed state. In this way, after the M.2 SSD is inserted into the connector 200, the M.2 SSD may be fixed by the limiting rod by adjusting the position of the sliding rod 31 in the first guiding slot 211.

Figure 5:
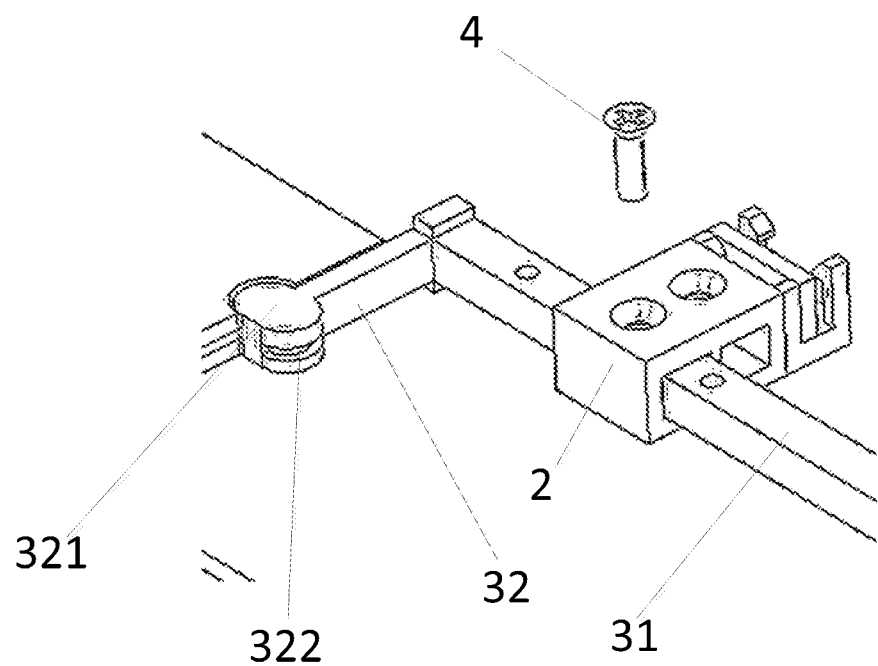
FIG. 5 is a schematic structural diagram of a limiting rod of a first adjusting fastener provided by an embodiment of the present disclosure.

In some embodiments, as shown in FIG. 5, a cylindrical snap-fit portion 321 is arranged at one end, far away from the sliding rod 31, of the limiting rod 32, and both sides of the cylindrical snap-fit portion 321 have arc-shaped grooves 322. Correspondingly, the M.2 SSD has a cylindrical groove matched with the cylindrical snap-fit portion 321, and there is a protruding portion matched with the arc-shaped groove inside the groove. In this way, when the M.2 SSD is fixed by the limiting rod 32, the cylindrical snap-fit portion 321 is accommodated in the cylindrical groove, and the protruding portion is accommodated in the arc-shaped groove 322.

In some embodiments, the sliding rod 31 of the first adjusting fastener 3 is located between the limiting rod 32 of the first adjusting fastener 3 and the connector 200; or, the limiting rod 32 of the first adjusting fastener 3 is located between the sliding rod 31 of the first adjusting fastener 3 and the connector 200.

Figure 6:
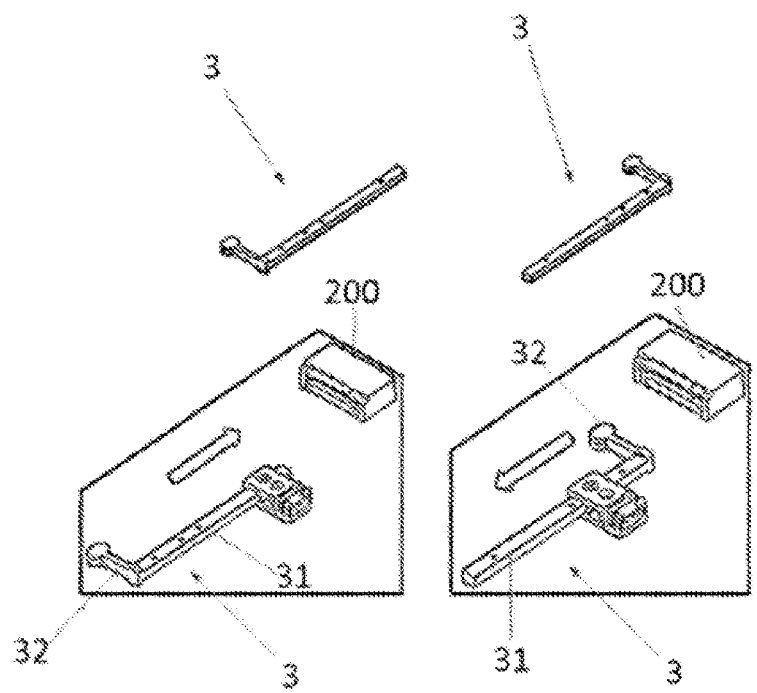
FIG. 6 is a schematic diagram of different positional relationships of a limiting rod and a sliding rod of a first adjusting fastener provided by an embodiment of the present disclosure.

As shown in FIG. 6, the first adjusting fastener 3 may support the M.2 SSDs with different lengths by adjusting relative positions of the limiting rod 32 and the sliding rods 31 to the connector 200. For example, when the sliding rod 31 of the first adjusting fastener 3 is located between the limiting rod 32 of the first adjusting fastener 3 and the connector 200, the first adjusting fastener 3 may support a relatively long M.2 SSD. When the limiting rod 32 of the first adjusting fastener 3 is located between the sliding rod 31 of the first adjusting fastener 3 and the connector 200, that is, the first adjusting fastener 3 is overturned by 180 degrees, a relatively short M.2 SSD may be supported.

In some embodiments, a second guiding slot 213 is further disposed inside the main body 21.

The hard disk fixing device 100 further includes a second adjusting fastener having a second sliding rod and a second limiting rod.

The second sliding rod of the second adjusting fastener is arranged in the second guiding slot. The second limiting rod of the second adjusting fastener is aligned with a second connector which is on the main board and the second connector is configured for connecting to a hard disk to be fixed; and a distance between the second limiting rod of the second adjusting fastener and the main board is greater than a distance between the limiting rod of the first adjusting fastener 3 and the main board.

Figure 7:
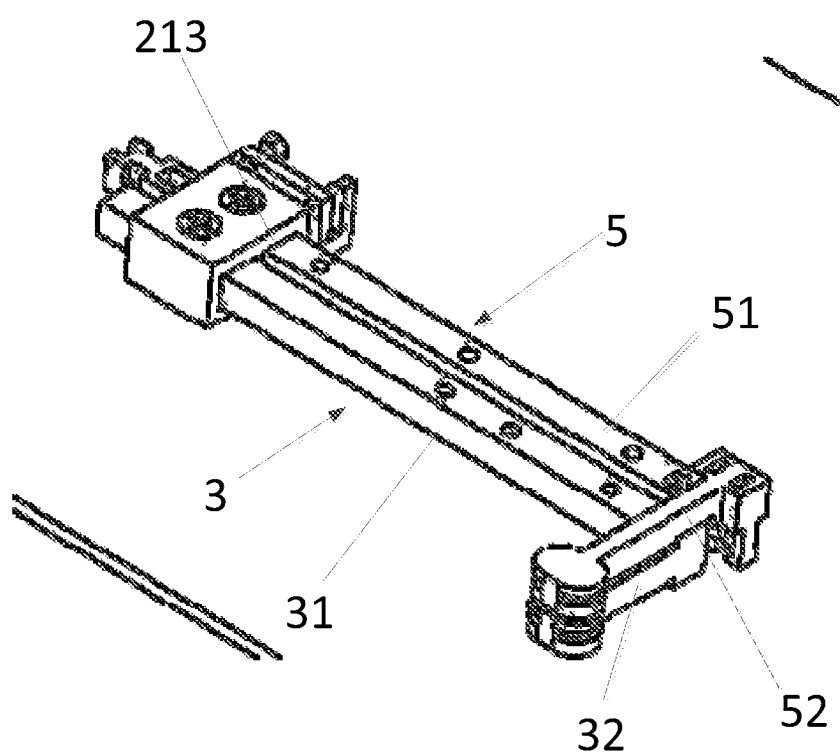
FIG. 7 is a schematic structural diagram of a second adjusting fastener provided by an embodiment of the present disclosure.

As shown in FIG. 3 and FIG. 7, a second guiding slot 213 and a second through hole 214 are also disposed inside a main body of a first supporting seat 2. The second groove 213 penetrates through the whole main body 21. The second through hole 214 is in communication with the second guide groove 213. The second guide groove 213 may accommodate the second adjusting fastener 5. The second adjusting fastener 5 also includes a second sliding rod 51 and a second limiting rod 52. Similarly, the second limiting rod 52 of the second adjusting fastener 5 is aligned with the second connector 201. The second sliding rod of the second adjusting fastener 5 also slides in the second guiding slot 213, then a distance between the second limiting rod 52 and the second connector 201 is adjusted, and finally, the second sliding rod 51 and the second limiting rod 52 of the second adjusting fastener 5 are fixed through the locking member 4.

In some embodiments, the connector 200 aligned with the limiting rod 32 of the first adjusting fastener 3 is located below the second connector 201 aligned with the second limiting rod 52 of the second adjusting fastener 5, so a distance between the second limiting rod 52 of the second adjusting fastener 5 and the main board 300 is greater than a distance between the limiting rod 32 of the first adjusting fastener 3 and the main board 300.

In some embodiments, each of both ends of the second sliding rod 51 of the second adjusting fastener 5 includes:
  a limiting hole 511, disposed in the second sliding rod 51 of the second adjusting fastener 5; and
  a limiting slot 512, disposed in a side surface of the second sliding rod 51 of the second adjusting fastener 5.

One end of the second limiting rod 52 of the second adjusting fastener 5 has a first elastic buckle 521 and a second elastic buckle 522. The first elastic buckle 521 is inserted into the limiting slot 512, and the second elastic buckle 522 is inserted into the limiting hole 511; or, the first elastic buckle 521 is inserted into the limiting hole 511, and the second elastic buckle 522 is inserted into the limiting slot 512.

Figure 8:
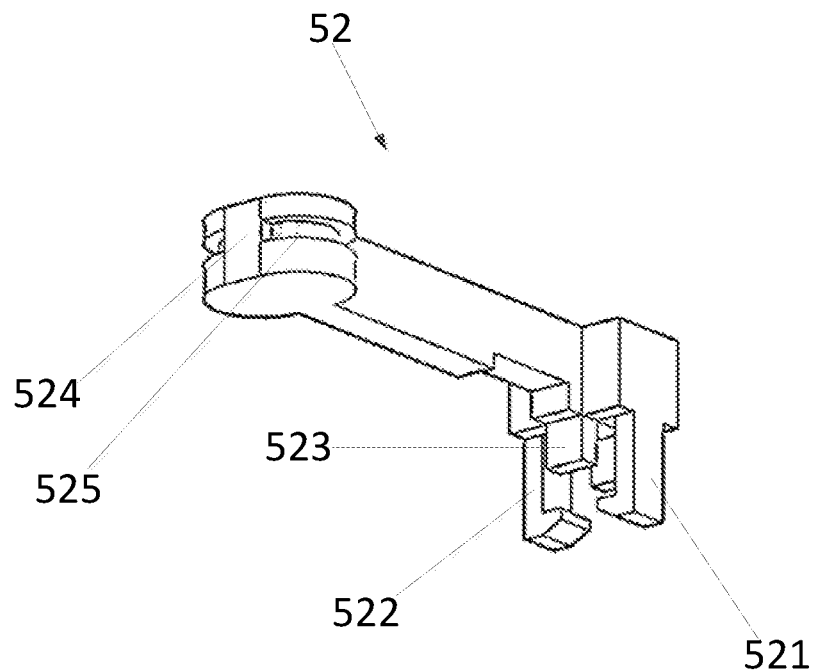
FIG. 8 is a schematic structural diagram of a second limiting rod of a second adjusting fastener provided by an embodiment of the present disclosure.
Figure 9:
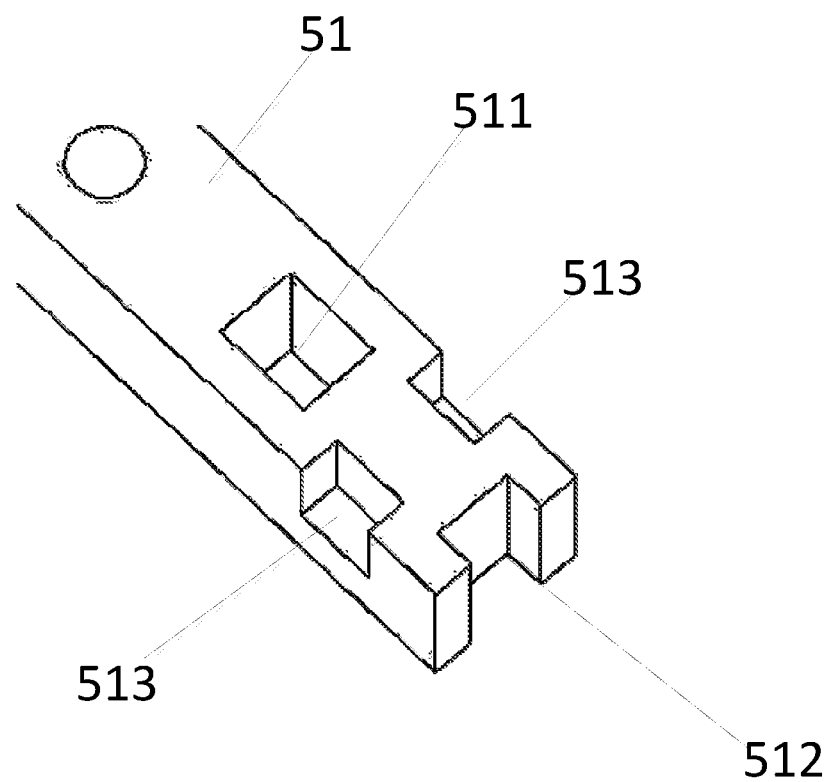
FIG. 9 is a schematic structural diagram of a second sliding rod of a second adjusting fastener provided by an embodiment of the present disclosure.
Figure 10:
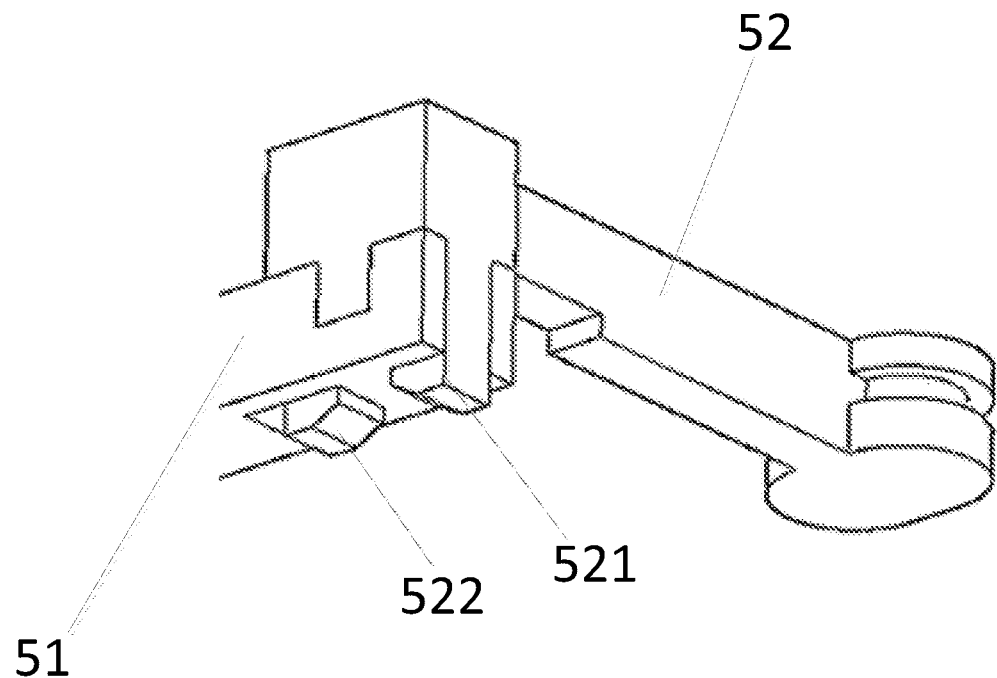
FIG. 10 is a schematic structural diagram after snap-fitting of a second limiting rod and a sliding rod of a second adjusting fastener provided by an embodiment of the present disclosure.

As shown in FIG. 8 and FIG. 9, the limiting hole 511 and the limiting slot 512 are disposed in the second sliding rod 51 of the second adjusting fastener 5, and the second limiting rod 52 of the corresponding second adjusting fastener 5 has the first elastic buckle 521 and the second elastic buckle 522. When the second limiting rod 52 of the second adjusting fastener 5 is connected to the second sliding rod 51, the first elastic buckle 521 is inserted into the limiting slot 512, and the second elastic buckle 522 is inserted into the limiting hole 511; or, the first elastic buckle 521 is inserted into the limiting hole 511, and the second elastic buckle 522 is inserted into the limiting slot 512. Similarly, when the first elastic buckle 521 and the second elastic buckle 522 are inserted into corresponding positions, the first elastic buckle 521 and the second elastic buckle 522 are propped open outwards. After the first elastic buckle 521 and the second elastic buckle 522 are completely inserted, as shown in FIG. 10, triangular snap-fit members of the first elastic buckle 521 and the second elastic buckle 522 may be snap-fitted at a bottom surface of the second sliding rod 51.

In some embodiments, as shown in FIG. 8 and FIG. 9, two positioning slots 513 are also disposed in the second sliding rod 51 of the second adjusting fastener 5, and two positioning pins 523 are also arranged on the corresponding second limiting rod 52.

In some embodiments, as shown in FIG. 8, a second cylindrical snap-fit portion 524 is arranged at one end, far away from the second sliding rod 51 of the second adjusting fastener 5, of the second limiting rod 52 of the second adjusting fastener 5, and both sides of the second cylindrical snap-fit portion 524 have second arc-shaped grooves 525. Correspondingly, the M.2 SSD has a cylindrical groove matched with the second cylindrical snap-fit portion 524, and there in a protruding portion matched with the arc-shaped groove 525 inside the groove. In this way, when the M.2 SSD is fixed by the second limiting rod 52, the second cylindrical snap-fit portion 524 is accommodated in the cylindrical groove, and the protruding portion is accommodated in the second arc-shaped groove 525.

In some embodiments, when the first elastic buckle 521 is inserted into the limiting groove 512 and the second elastic buckle 522 is inserted into the limiting hole 511, the second sliding rod 51 of the second adjusting fastener 5 is located between the second limiting rod 52 of the second adjusting fastener 5 and the second connector 201.

When the first elastic snap-fit member 521 is inserted into the limiting hole 511 and the second elastic snap-fit member 522 is inserted into the limiting groove 512, the second limiting rod 52 of the second adjusting fastener 5 is located between the second sliding rod 51 of the second adjusting fastener 5 and the second connector 201.

Figure 11:
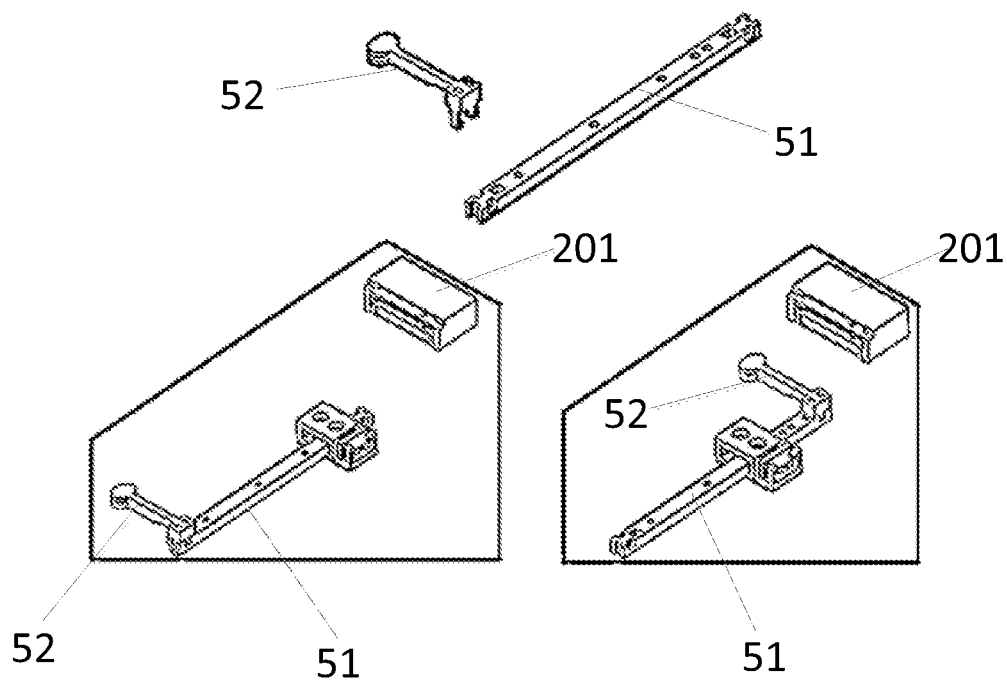
FIG. 11 is a schematic diagram of different positional relationships of a second limiting rod and a sliding rod of a second adjusting fastener provided by an embodiment of the present disclosure.

As shown in FIG. 11, the second adjusting fastener 5 may support the M.2 SSDs with different lengths by adjusting relative positions of the second limiting rod 52 and the second sliding rod 51 of the second adjusting fastener 5 to the second connector 201. For example, when the second sliding rod 51 of the second adjusting fastener 5 is located between the second limiting rod 52 of the second adjusting fastener 5 and the second connector 201, the second adjusting fastener 5 may support a relatively long M.2 SSD. When the second limiting rod 52 of the second adjusting fastener 5 is located between the second sliding rod 51 of the second adjusting fastener 5 and the second connector 201, that is, the second limiting rod 52 is inserted into a front end of the second sliding rod 51, a relatively short M.2 SSD may be supported.

In some embodiments, the first supporting seat 2 further includes:
  a limiting portion 23, connected to the other end of the extending portion 22. The first pair of elastic snap-fit members 12 is located between the limiting portion 23 and the main body 21 when the extending portion 22 is snap-fitted between the first pair of elastic snap-fit members 12 under the action of an external force.

As shown in FIG. 3, the limiting portion 23 is also arranged on the first supporting seat 2. The limiting portion 23 is connected to the other end of the extending portion 22. In this way, the first pair of elastic snap-fit members 12 is located between the limiting portion 23 and the main body 21 when the extending portion 22 is snap-fitted between the first pair of elastic snap-fit members 12, so that relative displacement may not be produced between the first supporting seat 2 and the base 11.

In some embodiments, the seating 1 further includes a second pair of elastic snap-fit members.

The hard disk fixing device 100 further includes a second supporting seat with the same structure as the first supporting seat 2, a third adjusting fastener with the same structure as the first adjusting fastener 3, and a fourth adjusting fastener with the same structure as the second adjusting fastener.

Figure 12:
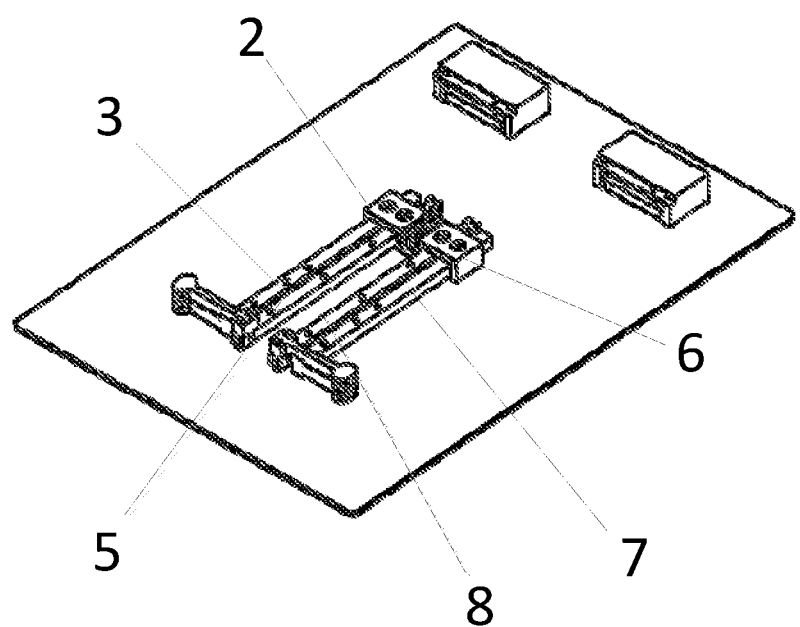
FIG. 12 is a schematic structural diagram of a second supporting seat, a third adjusting fastener, and a fourth adjusting fastener provided by an embodiment of the present disclosure.

As shown in FIG. 3 and FIG. 12, a second pair of elastic snap-fit members 14 may also be arranged on the seating 1, and the second pair of elastic snap-fit members 14 has the same structure as the first pair of elastic snap-fit members 12, so that the second supporting seat 6 with the same structure as the first supporting seat 2 may be fixed, and then the third adjusting fastener 7 with the same structure as the first adjusting fastener 3 and the fourth adjusting fastener 8 with the same structure as the second adjusting fastener 5 are fixed by using the second supporting seat 6.

In this way, at most four groups of M.2 SSDs may be supported by four adjusting fasteners. Moreover, each adjusting fastener may fix the M.2 SSDs with different lengths and positions by adjusting the positions of the sliding rod and the limiting rod. For example, a long M.2 SSD or a short M.2 SSD may be fixed only through the first adjusting fastener 3, or two long M.2 SSDs or two short M.2 SSDs or one long and one short M.2 SSDs may also be fixed through the first adjusting fastener 3 and the second adjusting fastener 5, or four long M.2 SSDs or four short M.2 SSDs or two long and two short M.2 SSDs or one long and three short M.2 SSDs may also be fixed through four adjusting fasteners.

In some embodiments, the first supporting seat 2 further includes:
  a second main body, connected to the extending portion. The structure of the second main body is the same as the structure of the main body.

In some embodiments, the hard disk fixing device 100 further includes a third adjusting fastener with the same structure as the first adjusting fastener 3, and a fourth adjusting fastener with the same structure as the second adjusting fastener.

In the present embodiment, the limiting portion may be directly replaced with the second main body, that is, an extending portion is arranged between the main body and the second main body, and the extending portion is snap-fitted into the first pair of elastic snap-fit members, so that the main body and the second main body serve as the limiting portions for each other to avoid a relative displacement. Other structures of the second main body are the same as the structure of the main body, so that the third adjusting fastener with the same structure as the first adjusting fastener 3 and the fourth adjusting fastener with the same structure as the second adjusting fastener may be accommodated.

By the solution provided by the present disclosure, one screw hole needs to be formed in the main board to fix the M.2 SSD, which prevents the M.2 SSD from loosening during transporting or handling. For the M.2 SSDs with different lengths or a double-layer and side-by-side M.2 connectors, diversified fixing methods are provided, and only different styles of adjusting fasteners need to be mounted without forming another hole in the main board. For the M.2 SSDs with different lengths, the first adjusting fastener 3 or the third adjusting fastener may change different directions to support the M.2 SSDs with different lengths, and the second adjusting fastener and the fourth adjusting fastener may support the M.2 SSDs with different lengths through the limiting rod inserting into different positions of the sliding rod. Four groups of M.2 SSDs with different lengths may be supported by four adjusting fasteners.

Based on the same inventive concept, the embodiments of the present disclosure further provide a server, which includes the hard disk fixing device 100 provided by any of the above embodiments.

The above are exemplary embodiments of the present disclosure, but it should be noted that, various changes and modifications may be made without departing from the scope disclosed in the embodiments of the present disclosure as defined in the claims. In addition, although elements disclosed in the embodiments of the present disclosure may be described or claimed in the singular, unless explicitly limited to the singular, the plural may also be construed.

It is to be understood that, as used herein, the singular form "a" is intended to include the plural form as well, unless the context clearly supports an exception. It is also be understood that, "and/or" as used herein is meant to include any and all possible combinations of one or more of the associated listed items.

The serial numbers of the foregoing embodiments of the present disclosure are merely for description, and do not represent the superiority or inferiority of the embodiments.

Those of ordinary skill in the art should understand that, the discussion of any of the above embodiments is merely exemplary, and is not intended to imply that the scope (including the claims) disclosed in the embodiments of the present disclosure is limited to these examples. Under the idea of the embodiments of the present disclosure, the technical features in the above embodiments or different embodiments may also be combined. In addition, there are many other changes in different aspects of the above embodiments of the present disclosure, which are not provided in detail for the sake of brevity. Therefore, any omissions, modifications, equivalent replacements, improvements and the like made within the spirit and principle of the embodiments of the present disclosure shall all fall within the protection scope of the embodiments of the present disclosure.

The invention claimed is:

1. A hard disk fixing device, comprising:
   a seating comprising a base fixed on a main board and a first pair of elastic snap-fit members perpendicular to the base and arranged at two sides of the base;
   a first supporting seat comprising a main body and an extending portion extending from the main body, wherein the extending portion is capable of being snap-fitted between the first pair of elastic snap-fit members, a first guiding slot is arranged inside the main body and a through hole is arranged in a side surface of the main body, and the first guiding slot is in communication with the through hole;
   a first adjusting fastener comprising a sliding rod and a limiting rod connected to the sliding rod, wherein the limiting rod is aligned with a connector on the main board and configured for connecting to a hard disk to be fixed, and the sliding rod is capable of sliding in the first guiding slot to adjust a distance between the limiting rod and the connector; and
   a locking member arranged in the through hole and capable of abutting against the sliding rod to lock the sliding rod.

2. The hard disk fixing device according to claim 1, wherein the sliding rod of the first adjusting fastener is located between the limiting rod of the first adjusting fastener and the connector; or, the limiting rod of the first adjusting fastener is located between the sliding rod of the first adjusting fastener and the connector.

3. The hard disk fixing device according to claim 1, wherein a second guiding slot is further arranged inside the main body;
   the hard disk fixing device further comprises a second adjusting fastener having a second sliding rod and a second limiting rod;
   wherein the second sliding rod of the second adjusting fastener is arranged in the second guiding slot; the second limiting rod of the second adjusting fastener is aligned with a second connector on the main board and configured for connecting to the hard disk to be fixed; and a distance between the second limiting rod of the second adjusting fastener and the main board is greater than a distance between the limiting rod of the first adjusting fastener and the main board.

4. The hard disk fixing device according to claim 3, wherein the second sliding rod of the second adjusting fastener comprises:
   a limiting hole disposed in the second sliding rod of the second adjusting fastener;
   a limiting slot disposed in a side surface of the second sliding rod of the second adjusting fastener, one end of the second limiting rod of the second adjusting fastener having a first elastic buckle and a second elastic buckle;
   wherein the first elastic buckle is inserted into the limiting slot, and the second elastic buckle is inserted into the limiting hole; or, the first elastic buckle is inserted into the limiting hole, and the second elastic buckle is inserted into the limiting slot.

5. The hard disk fixing device according to claim 4, wherein the second sliding rod of the second adjusting fastener is located between the second limiting rod of the second adjusting fastener and the second connector in a state that the first elastic buckle is inserted into the limiting slot, and the second elastic buckle is inserted into the limiting hole; and
   the second limiting rod of the second adjusting fastener is located between the second sliding rod of the second adjusting fastener and the second connector in a state that the first elastic buckle is inserted into the limiting hole, and the second elastic buckle is inserted into the limiting slot.

6. The hard disk fixing device according to claim 5, wherein the first supporting seat further comprises:
   a limiting portion connected to the other end of the extending portion, wherein the first pair of elastic snap-fit members are located between the limiting portion and the main body in a state that the extending portion is snap-fitted between the first pair of elastic snap-fit members.

7. The hard disk fixing device according to claim 6, wherein the seating further comprises a second pair of elastic snap-fit members; and
   the hard disk fixing device further comprises a second supporting seat with the same structure as the first supporting seat, a third adjusting fastener with the same structure as the first adjusting fastener, and a fourth adjusting fastener with the same structure as the second adjusting fastener.

8. The hard disk fixing device according to claim 5, wherein the first supporting seat further comprises:
   a second main body connected to the extending portion, wherein the structure of the second main body is the same as the structure of the main body.

9. The hard disk fixing device according to claim 8, wherein the hard disk fixing device further comprises a third adjusting fastener with the same structure as the first adjusting fastener, and a fourth adjusting fastener with the same structure as the second adjusting fastener.

10. The hard disk fixing device according to claim 1, wherein the hard disk to be fixed is located between the connector and the limiting rod.

11. A server, comprising the hard disk fixing device according to claim 1.

12. The hard disk fixing device according to claim 1, wherein the first pair of elastic snap-fit members comprise two elastic snap-fit members, and each elastic snap-fit member comprises an elastic arm and a triangular snap-fit member arranged at one end, far away from the base, of the elastic arm and protrudes inwards.

13. The hard disk fixing device according to claim 12, wherein the extending portion extends out from a side surface of the main body, a length of a cross section of the extending portion is less than a length of a side surface of the main body, and a height of the cross section of the extending portion is less than a height of the side surface of the main body.

14. The hard disk fixing device according to claim 13, wherein a length of the cross section of the extending portion is not less than a distance between the first pair of elastic snap-fit members, and the height of the cross section of the extending portion is equal to a height of the elastic arm.

15. The hard disk fixing device according to claim 1, wherein when the locking member is arranged in the through hole and the locking member locks, the sliding rod is in a fixed state, so that the limiting rod is located in a fixed state.

16. The hard disk fixing device according to claim 1, wherein one end, far away from the sliding rod, of the limiting rod is provided with a cylindrical snap-fit portion, and both sides of the cylindrical snap-fit portion have arc-shaped grooves.

17. The server according to claim 11, wherein the sliding rod of the first adjusting fastener is located between the limiting rod of the first adjusting fastener and the connector; or, the limiting rod of the first adjusting fastener is located between the sliding rod of the first adjusting fastener and the connector.

18. The server according to claim 11, wherein a second guiding slot is further arranged inside the main body;

the hard disk fixing device further comprises a second adjusting fastener having a second sliding rod and a second limiting rod;

wherein the second sliding rod of the second adjusting fastener is arranged in the second guiding slot; the second limiting rod of the second adjusting fastener is aligned with a second connector on the main board and configured for connecting to the hard disk to be fixed; and a distance between the second limiting rod of the second adjusting fastener and the main board is greater than a distance between the limiting rod of the first adjusting fastener and the main board.

19. The server according to claim 18, wherein the second sliding rod of the second adjusting fastener comprises:

a limiting hole disposed in the second sliding rod of the second adjusting fastener;

a limiting slot disposed in a side surface of the second sliding rod of the second adjusting fastener, one end of the second limiting rod of the second adjusting fastener having a first elastic buckle and a second elastic buckle;

wherein the first elastic buckle is inserted into the limiting slot, and the second elastic buckle is inserted into the limiting hole; or, the first elastic buckle is inserted into the limiting hole, and the second elastic buckle is inserted into the limiting slot.

20. The server according to claim 19, wherein the second sliding rod of the second adjusting fastener is located between the second limiting rod of the second adjusting fastener and the second connector in a state that the first elastic buckle is inserted into the limiting slot, and the second elastic buckle is inserted into the limiting hole; and the second limiting rod of the second adjusting fastener is located between the second sliding rod of the second adjusting fastener and the second connector in a state that the first elastic buckle is inserted into the limiting hole, and the second elastic buckle is inserted into the limiting slot.

* * * * *